United States Patent
Park (10) Patent No.: US 9,907,216 B2
(45) Date of Patent: Feb. 27, 2018

(54) APPARATUS WITH DIRECT COOLING PATHWAY FOR COOLING BOTH SIDES OF POWER SEMICONDUCTOR

(71) Applicant: HYUNDAI MOBIS Co., Ltd., Yongin-si, Gyeonggi-do (KR)

(72) Inventor: Young Seop Park, Yongin-si (KR)

(73) Assignee: HYUNDAI MOBIS Co., Ltd., Yongin-si (KR)

( * ) Notice: Subject to any disclaimer, the term of this patent is extended or adjusted under 35 U.S.C. 154(b) by 0 days.

(21) Appl. No.: 15/288,891

(22) Filed: Oct. 7, 2016

(65) Prior Publication Data
US 2017/0105320 A1 Apr. 13, 2017

(30) Foreign Application Priority Data
Oct. 8, 2015 (KR) .................. 10-2015-0141526

(51) Int. Cl.
*H05K 7/20* (2006.01)
*H01L 23/473* (2006.01)
*H01L 23/373* (2006.01)

(52) U.S. Cl.
CPC ....... *H05K 7/20927* (2013.01); *H01L 23/373* (2013.01); *H05K 7/20254* (2013.01); *H05K 7/20909* (2013.01)

(58) Field of Classification Search
CPC .............. H01L 23/473; H05K 7/20254; H05K 7/20309; H05K 7/20927; H05K 7/20936
See application file for complete search history.

(56) References Cited

U.S. PATENT DOCUMENTS

| | | | | |
|---|---|---|---|---|
| 3,481,393 | A * | 12/1969 | Chu | F28F 3/12 |
| | | | | 165/104.31 |
| 5,920,457 | A * | 7/1999 | Lamb | H01L 23/473 |
| | | | | 165/104.33 |
| 6,052,284 | A * | 4/2000 | Suga | H01L 23/473 |
| | | | | 165/80.4 |
| 6,542,365 | B2 * | 4/2003 | Inoue | H01L 23/4006 |
| | | | | 165/80.4 |
| 7,656,016 | B2 * | 2/2010 | Yoshimatsu | H01L 25/112 |
| | | | | 165/80.4 |

(Continued)

FOREIGN PATENT DOCUMENTS

| | | | | |
|---|---|---|---|---|
| DE | 10334354 A1 * | 7/2004 | ........... | H01L 23/473 |
| DE | 102008052145 A1 * | 4/2010 | ........... | H01L 23/345 |
| FR | 2479566 A1 * | 10/1981 | ......... | H01L 23/3737 |

*Primary Examiner* — Robert J Hoffberg
(74) *Attorney, Agent, or Firm* — Knobbe Martens Olson & Bear LLP (57) ABSTRACT

An apparatus includes a cooling segment including an upper box having an open bottom surface facing a top surface of a power semiconductor and adhered to the top surface of the power semiconductor, and a lower box having an open top surface facing a bottom surface of the power semiconductor and adhered to the bottom surface of the power semiconductor, an inlet tank connected to an end portion of one side of the upper box and passing therethrough, and into which a fluid is introduced, an outlet tank connected to an end portion of one side of the lower box and passing therethrough, and into which a fluid is discharged, and a connection tank connected to an end portion of the other side of each of the upper box and the lower box and passing therethrough.

13 Claims, 4 Drawing Sheets

(56) References Cited

U.S. PATENT DOCUMENTS

| | | | | |
|---|---|---|---|---|
| 8,243,451 B2* | 8/2012 | Dede | ................ | F28F 3/046 |
| | | | | 165/104.33 |
| 8,385,068 B2* | 2/2013 | Jacobson | ............ | H01L 23/473 |
| | | | | 165/104.33 |
| 8,755,185 B2* | 6/2014 | Chou | ................ | H01L 23/3735 |
| | | | | 165/80.4 |
| 8,897,011 B2* | 11/2014 | Kwak | ................ | H01L 23/473 |
| | | | | 165/80.4 |
| 9,736,967 B2* | 8/2017 | Molitor | ............ | H05K 7/20218 |
| 2005/0128705 A1* | 6/2005 | Chu | ................ | H01L 23/473 |
| | | | | 361/699 |
| 2015/0114615 A1* | 4/2015 | Yang | ................ | F28F 27/02 |
| | | | | 165/287 |

* cited by examiner

APPARATUS WITH DIRECT COOLING PATHWAY FOR COOLING BOTH SIDES OF POWER SEMICONDUCTOR

CROSS-REFERENCE TO RELATED APPLICATION

This application claims priority to and the benefit of Korean Patent Application No. 10-2015-0141526, filed on Oct. 8, 2015, the disclosure of which is incorporated herein by reference in its entirety.

BACKGROUND

1. Field

The present invention relates to an apparatus with a direct cooling pathway for cooling both sides of a power semiconductor, and more particularly, to an apparatus with a direct cooling pathway for cooling both sides of a power semiconductor in which a fluid such as a cooling medium, cooling water, a heat exchange medium, or the like comes into direct contact with a top surface and a bottom surface of each of a plurality of power semiconductors to cool the power semiconductors.

2. Discussion of Related Art

Generally, fossil fuels such as gasoline and diesel have been used as power sources of vehicles. Water or hydrogen, which can be used as natural energy sources, electric energy, or the like have been used as power sources of environmentally-friendly vehicles (EFVs) for environmental protection.

Specifically, the EFVs may be divided into hybrid electric vehicles (HEVs), plug-in hybrid electric vehicles (PHEVs), electric vehicles (EVs), fuel cell electric vehicles (FCEVs), and the like.

Driving batteries having power of high voltage and current are used in the EFVs. A power control unit (PCU) or a power module is mounted in the EFV and adjusts power of the driving battery so as to match requirements of a motor to supply the power of the driving battery to the motor.

SUMMARY

The present invention is directed to an apparatus with a direct cooling pathway for cooling both sides of a power semiconductor including a plurality of cooling segments in which a cooling fluid comes into direct contact with a top surface and a bottom surface of the power semiconductor and heat is efficiently exchanged between the fluid and the power semiconductors.

The present invention is directed to an apparatus with a direct cooling pathway for cooling both sides of a power semiconductor, which increases productivity by removing a thermal grease applying process.

According to an aspect of the present invention, there is provided an apparatus with a direct cooling pathway for cooling both sides of a power semiconductor, the apparatus including a cooling segment including an upper box having an open bottom surface facing a top surface of a power semiconductor and adhered to the top surface of the power semiconductor, and a lower box having an open top surface facing a bottom surface of the power semiconductor and adhered to the bottom surface of the power semiconductor, an inlet tank connected to an end portion of one side of the upper box and passing therethrough, and into which a fluid is introduced, an outlet tank connected to an end portion of one side of the lower box and passing therethrough, and into which a fluid is discharged, and a connection tank connected to an end portion of the other side of each of the upper box and the lower box and passing therethrough. The cooling segment is provided in a plurality and the plurality of cooling segments are connected to each other by the number of power semiconductors, a direct cooling pathway is formed between the inlet tank and the connection tank or between the outlet tank and the connection tank, and the fluid comes into direct contact with the top surface and the bottom surface of the power semiconductor and cools the power semiconductor.

Further, the upper box may include a first hollow body having closed side surfaces and a closed top surface, a first connection pipe corresponding to an end portion of one side of the upper box, formed to pass through one side surface of the first hollow body, and having a relatively small diameter, a second connection pipe corresponding to an end portion of the other side of the upper box, formed to pass through the other side surface of the first hollow body, and having a stopping jaw formed inside an inner diameter into which a first connection pipe of another adjacent cooling segment is inserted, a first flange configured to protrude from an edge of a bottom surface of the first hollow body in an outward direction, having a mounting groove formed on the bottom surface thereof, and in which the bottom surface except for a portion in which the mounting groove is formed is adhered to the top surface of the power semiconductor, and a first O-ring coupled to the mounting groove of the first flange.

The lower box may include a second hollow body having closed side surfaces and a closed bottom surface, a third connection pipe corresponding to an end portion of one side of the lower box, formed to pass through one side surface of the second hollow body, and having a relatively small diameter, a fourth connection pipe corresponding to an end portion of the other side of the lower box, formed to pass through the other side surface of the second hollow body, and having a stopping jaw formed inside an inner diameter into which a third connection pipe of the other adjacent cooling segment is inserted, a second flange configured to protrude from an edge of a top surface of the second hollow body in an outward direction, having a mounting groove formed on the top surface thereof, and in which the top surface except for a portion in which the mounting groove is formed is adhered to the bottom surface of the power semiconductor, and a second O-ring coupled to the mounting groove of the second flange. The lower box may be formed to be vertically symmetrical to the upper box.

In the cooling segment, the power semiconductor may be interposed between the upper box and the lower box, and pins of the power semiconductor may protrude from both sides of the power semiconductor in a direction perpendicular to a connection direction of any one connection pipe of the first connection pipe to the fourth connection pipe.

The inlet tank may include an inlet pipe into which the fluid is introduced, a plurality of first fitting units connected to the first connection pipe of the cooling segment, and a first distribution header connected between the inlet pipe and the first fitting units and passing therethrough, and having an internal volume which distributes the fluid to the first fitting units.

The outlet tank may include a discharge pipe from which the fluid is discharged, a plurality of second fitting units connected to the third connection pipe of the cooling segment, and a second distribution header formed between the discharge pipe and the second fitting units and having an internal volume which discharges the fluid to the discharge pipe.

The connection tank may include a third distribution header having an internal volume for receiving the fluid from the upper box or supplying the fluid to the lower box, and a plurality of third fitting units formed on a side surface of the third distribution header and connected to the second connection pipe or the fourth connection pipe and passing therethrough.

The cooling segments may be serially connected to each other between the inlet tank and the connection tank or between the outlet tank and the connection tank and may constitute a cooling segment assembly having a serial connection structure, and the cooling segment assembly may be provided in a plurality and the plurality of cooling segment assemblies may be spaced apart from each other to form a parallel connection structure.

BRIEF DESCRIPTION OF THE DRAWINGS

The above and other aspects, features and advantages of the present invention will become more apparent to those of ordinary skill in the art by describing in detail embodiments thereof with reference to the accompanying drawings, in which.

DETAILED DESCRIPTION OF EMBODIMENTS

Advantages and features of the present invention and methods of achieving the same should be clearly understood with reference to the accompanying drawings and the following detailed embodiments. However, the present invention is not limited to the embodiments to be disclosed below, and may be implemented in various different forms. The embodiments are provided in order to fully explain the present invention and fully explain the scope of the present invention for those skilled in the art. The scope of the present invention is defined by the appended claims.

Meanwhile, the terms used herein are provided to only describe embodiments of the present invention and not for purposes of limitation. Unless the context clearly indicates otherwise, singular forms include plural forms. It should be understood that the terms "comprise" and/or "comprising" when used herein, specify some stated components, steps, operations and/or elements, but do not preclude the presence or addition of one or more other components, steps, operations and/or elements. Hereinafter, embodiments of the present invention will be described in detail with reference to the accompanying drawings.

As discussed above, driving batteries having power of high voltage and current are used in the EFVs. A power control unit (PCU) or a power module is mounted in the EFV and adjusts power of the driving battery so as to match requirements of a motor to supply the power of the driving battery to the motor.

The power module includes an inverter, a smoothing condenser, and a converter, or includes a power semiconductor which is a power converter.

The power semiconductor generates heat by supplying power (electricity). For this reason, the power semiconductor needs a separate cooling means.

Cooling performance is an important factor in a design of the power semiconductor or the power converter.

A cooling means for a power module in the vehicle field according to the related art may have a means for cooling only a single side of an electric element or may have a means for cooling both sides of the electric element.

For example, a heat exchanger for cooling an electric element according to the related art includes a first tube, a second tube, an inlet, an outlet, and a connector. Here, the first tube has an internal space which is formed between a pair of plates that face each other and is disposed on one side surface of the electric element in a height direction of the electric element in order to flow a fluid such as a cooling medium, cooling water, a heat exchange medium, or the like. The second tube is disposed on the other side surface of the electric element. The inlet is formed at one side end relative to a length direction of the first tube. The outlet is formed at the other side end relative to a length direction of the second tube. The connector connects the first tube to the second tube.

However, according to the related art, a fluid flows along internal spaces of the first tube and the second tube. In this case, coolness of the fluid or heat of the electric element is transferred to the electric element through a wall of the first tube or a wall of the second tube.

That is, heat exchange in an indirect cooling method is made between the heat exchanger for cooling the electric element according to the related art and the electric element.

Further, in the heat exchanger for cooling the electric element according to the related art, thermal grease is applied between a surface of the electric element and an outer surface of the tube. It is difficult to manufacture the electric element and the heat exchanger due to the application of the thermal grease and, as a result, productivity is significantly reduced.

Further, in the heat exchanger for cooling the electric element according to the related art, since two walls (an upper wall and a lower wall) of the first tube or the second tube are located at a top surface and a bottom surface of the electric element, an entire thickness of the heat exchanger is relatively increased. It is difficult to manufacture a compact heat exchanger due to the increased thickness.

Further, since the heat exchanger for cooling the electric element according to the related art uses an indirect cooling method, efficiency of heat exchange is relatively reduced.

Meanwhile, as another technique in the related art, in a technique in which a plurality of electric elements are integrated into a single body or are packaged together, there is a disadvantage in that cooling performance of each of the electric elements is reduced and the entire cooling efficiency of the package including the electric elements and a housing is relatively reduced compared to that in the direct cooling method.

Meanwhile, in the heat exchanger for cooling the electric element according to the related art, the electric elements are fitted between the first tube and the second tube by force. The first tube or the second tube is pressed to come into close contact with the electric elements. For this reason, the first tube or the second tube is deformed due to the compression. This causes a quality problem of the heat exchanger.

Further, in the heat exchanger for cooling the electric element according to the related art, pins of the electric element have to be matched at connection positions of pins of a printed circuit board (PCB) when the heat exchanger and the electric element are assembled. However, since the electric element and the heat exchanger are pre-manufactured and are assembled to each other, it is very difficult to arrange positions of the pins.

That is, a separate process of arranging the positions of the pins has to be inserted into an assembly process of the heat exchanger and the electric element. In this case, a total cycle time of the assembly process is increased. This results in relative reduction of productivity.

Further, in the heat exchanger for cooling the electric element according to the related art, the length of the tube is predetermined. Therefore, it is difficult to increase or decrease the number of the electric elements which will be assembled into the tube. Further, a separate tube has to be manufactured according to an increase or reduction of the number of the electric elements. That is, the heat exchanger for cooling the electric element according to the related art has relatively very low versatility or extensibility.

Figure 1:
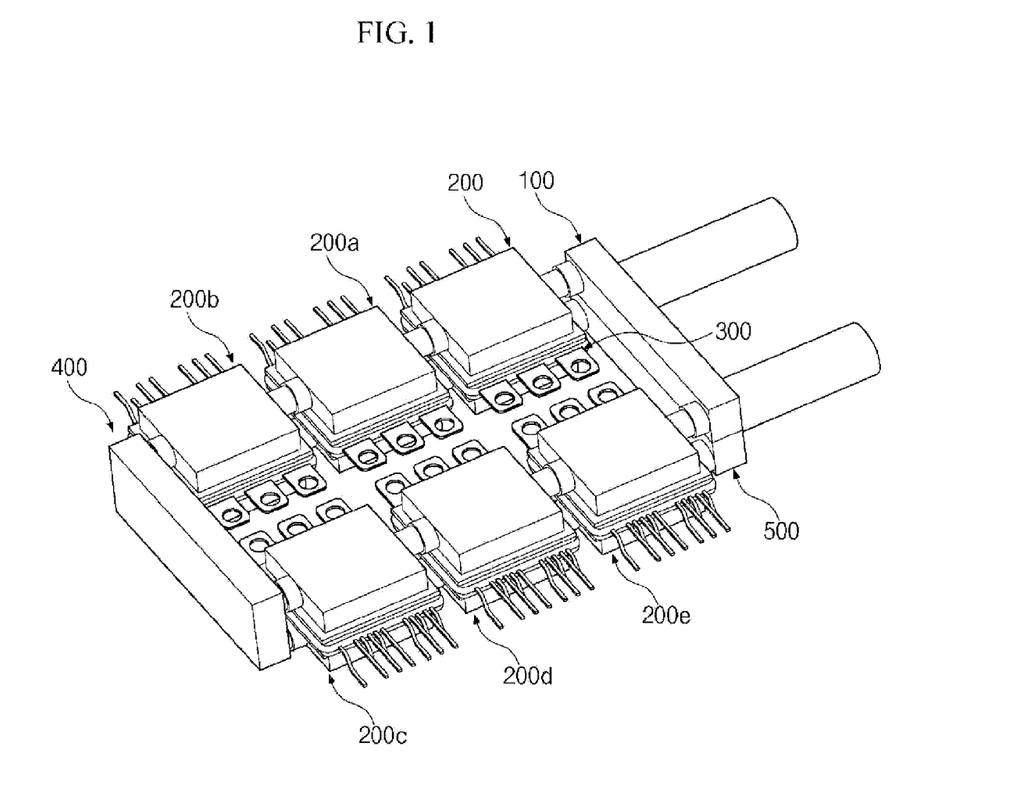
FIG. 1 is a perspective view illustrating an apparatus with a direct cooling pathway for cooling both sides of a power semiconductor according to one embodiment of the present invention.

FIG. 1 is a perspective view illustrating an apparatus with a direct cooling pathway for cooling both sides of a power semiconductor according to one embodiment of the present invention.

Referring to FIG. 1, the apparatus with the direct cooling pathway for cooling both sides of a power semiconductor in the present embodiment includes a plurality of cooling segments 200, 200a, 200b, 200c, 200d, and 200e corresponding to the number of power semiconductors 300 (e.g., six), an inlet tank 100, an outlet tank 500, and a connection tank 400.

The cooling segments 200, 200a, 200b, 200c, 200d, and 200e, the inlet tank 100, the outlet tank 500, and the connection tank 400 are formed of engineering plastic, a strong synthetic resin by thermal stress, or any one material of an easily moldable metal or non-metal, and are injection-molded in shapes to be described below.

The cooling segments 200, 200a, 200b, 200c, 200d, and 200e are manufactured or assembled into a single body by interposing the power semiconductors 300 at intermediate positions of their thickness directions.

Each of the power semiconductors 300 is interposed between an upper box and a lower box of each of the cooling segments 200, 200a, 200b, 200c, 200d, and 200e.

The upper box of each of the cooling segments 200, 200a, 200b, 200c, 200d, and 200e has a bottom surface which is open and is adhered to a top surface of the power semiconductor 300. Further, the lower box has a top surface, which is open and is adhered to a bottom surface of the power semiconductor 300, facing a bottom surface of the power semiconductor 300.

The inlet tank 100 is connected to end portions of one side of the upper boxes of the cooling segments 200 and 200e disposed at one side and passing therethrough, and serves to receive a fluid from an external heat emission apparatus and supply or distribute the fluid to internal spaces of the upper boxes of the cooling segments 200 and 200e.

Here, the fluid refers to a material that can absorbs or emit much heat while changing its state such as a cooling medium, cooling water, a heat exchange medium, and a phase change material (PCM) and that circulates between the external heat emission apparatus and the apparatus in the present embodiment. Since the PCM even uses latent heat, efficiency of heat exchange may be relatively superior compared to other media.

The outlet tank 500 has the same volume or planar area as the inlet tank 100 and is stacked on the inlet tank 100.

The outlet tank 500 is connected to end portions of one side of the lower boxes of the cooling segments 200 and 200e disposed at the one side and passing therethrough, and serves to receive a fluid from internal spaces of the lower boxes of the cooling segments 200 and 200e and discharge the fluid to the external heat emission apparatus.

The connection tank 400 is connected to end portions of the other side of each of upper boxes and lower boxes of cooling segments 200b and 200c disposed at the other side and passing therethrough.

The connection tank 400 serves to receive a fluid in the upper box of the cooling segment 200b and then provide the fluid into the lower box of the same cooling segment 200b.

Further, the connection tank 400 serves to receive a fluid in the upper box of the other cooling segment 200c connected to the cooling segment 200b in a parallel connection structure and then provide the fluid into the lower box of the corresponding cooling segment 200c.

In embodiments, the fluids in the upper boxes of the plurality of cooling segments 200b and 200c may be mixed with each other in the connection tank 400 and then may flow into the lower boxes of the cooling segments 200b and 200c.

Such cooling segments 200, 200a, 200b, 200c, 200d, and 200e are connected to each other through the number of the power semiconductors 300, a direct cooling pathway is formed between the inlet tank 100 and the connection tank 400 or between the outlet tank 500 and the connection tank 400, and the fluid comes into direct contact with the top surfaces and the bottom surfaces of the power semiconductors 300 to cool the power semiconductors 300.

The cooling segments 200, 200a, 200b, 200c, 200d, and 200e are individually manufactured for each power semiconductor 300 and are then assembled to pass through each other in a pipe connection method.

Figure 2:
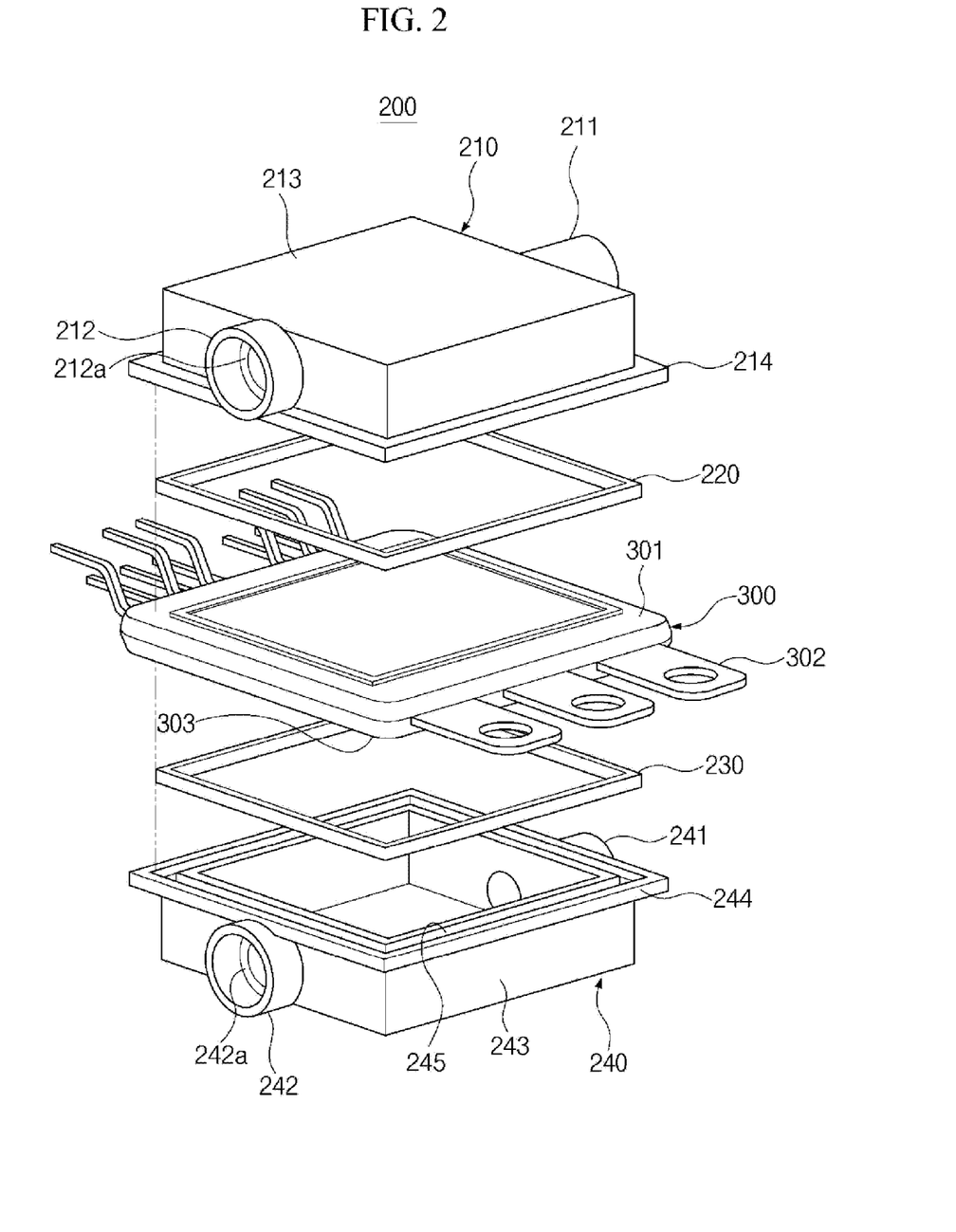
FIG. 2 is an exploded perspective view illustrating a cooling segment illustrated in FIG. 1.

Each of the cooling segments 200, 200a, 200b, 200c, 200d, and 200e has a configuration and a coupling relationship illustrated in FIG. 2 so that such assembly is possible.

In FIG. 2, a detailed configuration and a coupling relationship of a single cooling segment 200 are described for convenience of description, and this description may be applied equally to all of the other cooling segments 200a, 200b, 200c, 200d, and 200e.

FIG. 2 is an exploded perspective view illustrating the cooling segment illustrated in FIG. 1.

Referring to FIG. 2, the cooling segment 200 largely includes an upper box 210 and a lower box 240 as components disposed above and below the power semiconductor 300. The upper box 210 and the lower box 240 may be injection-molded structures molded with a plastic material and the like.

The upper box 210 has a first hollow body 213 having a rectangular box-shaped structure in which side surfaces and a top surface are closed and a bottom surface is open. Here, a fluid storage space in which a fluid is filled or flows is formed inside the first hollow body 213.

Further, the upper box 210 has a first connection pipe 211 which corresponds to an end portion of one side of the upper box 210, is formed to pass through one side surface of the first hollow body 213, and has a relatively small diameter.

Further, the upper box 210 has a second connection pipe 212 which corresponds to an end portion of the other side of the upper box 210, is formed to pass through the other side surface of the first hollow body 213, and has a stopping jaw 212a formed inside an inner diameter thereof into which a first connection pipe of another adjacent cooling segment may be inserted.

Further, the upper box 210 has a first flange 214 which protrudes from a bottom edge of the first hollow body 213 in an outward direction, extends along the bottom edge, has a mounting groove formed on a bottom surface thereof, and in which the bottom surface except for a portion in which the mounting groove is formed is adhered to a top surface 301 of the power semiconductor 300.

Further, the upper box 210 includes a first O-ring 220 coupled to the mounting groove of the first flange 214.

The lower box 240 has a second hollow body 243 having a rectangular box shaped structure in which side surfaces and a bottom surface are closed and a top surface is open. Here, a fluid storage space in which a fluid is filled or flows is formed in the second hollow body 243.

Further, the lower box 240 has a third connection pipe 241 which corresponds to an end portion of one side of the lower box 240, is formed to pass through one side surface of the second hollow body 243, and has a relatively small diameter. Here, the third connection pipe 241 has the same size, diameter (outer diameter), and inner diameter as the first connection pipe 211.

Further, the lower box 240 has a fourth connection pipe 242 which corresponds to an end portion of the other side of the lower box 240, is formed to pass through the other side surface of the second hollow body 243, and has a stopping jaw 242a formed inside an inner diameter thereof into which a third connection pipe of the other adjacent cooling segment may be inserted. Here, the fourth connection pipe 242 has the same size, outer diameter, and inner diameter as the second connection pipe 212.

The stopping jaw 242a comes into contact with an end of the third connection pipe of the adjacent other cooling segment and serves to constantly maintain an insertion depth of the third connection pipe to be within a predetermined range.

To this end, all of the stopping jaws 212a and 242a have an inner diameter having a size which is matched to the inner diameter of the first connection pipe or the third connection pipe. Therefore, there may be no flow loss or relatively very little flow loss of fluid inside the connection pipes.

Further, the lower box 240 has a second flange 244 which protrudes from an edge of a top surface of the second hollow body 243 in an outward direction, extends along the edge of the top surface, has a mounting groove 245 formed on the top surface, and in which the top surface except for a portion in which the mounting groove 245 is formed is adhered to a bottom surface 303 of the power semiconductor 300.

Further, the lower box 240 has a second O-ring 230 coupled to the mounting groove 245 of the second flange 244.

The lower box 240 is formed to be vertically symmetrical to the upper box 210.

Except for the first O-ring 220 and the second O-ring 230, a bottom surface of the first flange 214 or a top surface of the second flange 244 is fixed to the corresponding top surface 301 or bottom surface 303 of the power semiconductor 300 by any one of an adhesive means, a ultrasonic welding means, and a high-frequency welding means.

The first O-ring 220 or the second O-ring 230 may be formed to have a thickness relatively greater than a depth of the mounting groove, and may be elastically deformed by a compressive force generated while adhering after the insertion.

The first O-ring 220 and the second O-ring 230 may be commonly referred to as a rubber ring, a seal, a gasket, and the like.

The first O-ring 220 and the second O-ring 230 prevent leakage that may occur at a leakage portion despite the adhesion through elastic support and compression of each of the first O-ring 220 and the second O-ring 230.

A plurality of pins 302 of the power semiconductor 300 protrude from both sides of the power semiconductor 300 in a direction perpendicular to a connection direction of any one connection pipe of the first connection pipe 211 to the fourth connection pipe 242. The pins 302 are connected to a line inside a mold of the power semiconductor 300.

The pins 302 of the power semiconductor 300 may be connected to a printed circuit board (PCB) having connection portions or terminals to correspond to an interval between the power semiconductors 300. The pins 302 may be collectively referred to as a plurality of pin-shaped portions, terminal-shaped portions having holes, or the like.

Since protruding lengths of all of the connection pipes 211, 212, 241, and 242 are determined by an arrangement interval of the power semiconductors 300, the connection pipes 211, 212, 241, and 242 may be formed to have protruding lengths greater or smaller than the lengths illustrated in FIG. 2.

All of the connection pipes 211, 212, 241, and 242 may be molded to have large or small sized outer diameters and inner diameters in consideration of a flow rate of the fluid or cooling performance.

Figure 3:
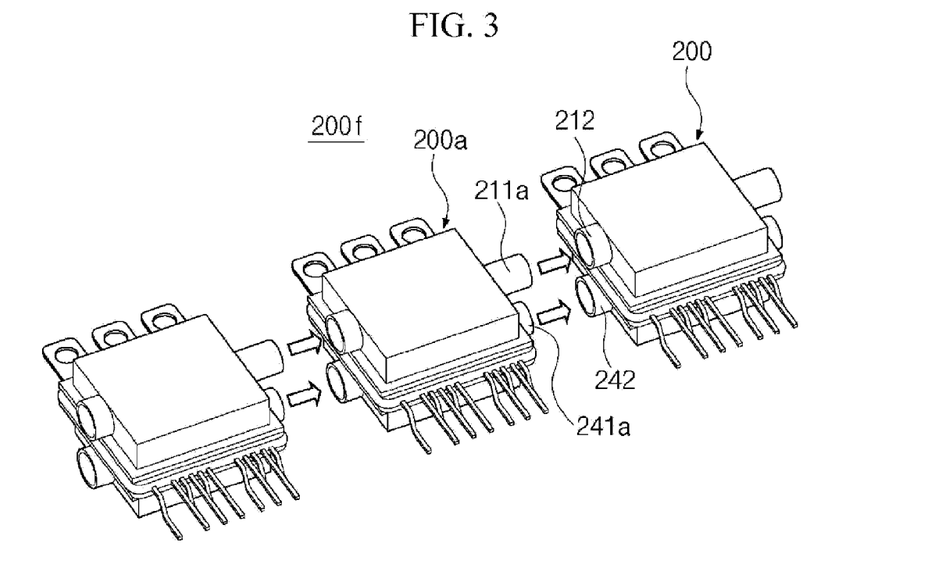
FIGS. 3 and 4 are perspective views for describing a coupling relationship between cooling segments illustrated in FIG. 2.
Figure 4:
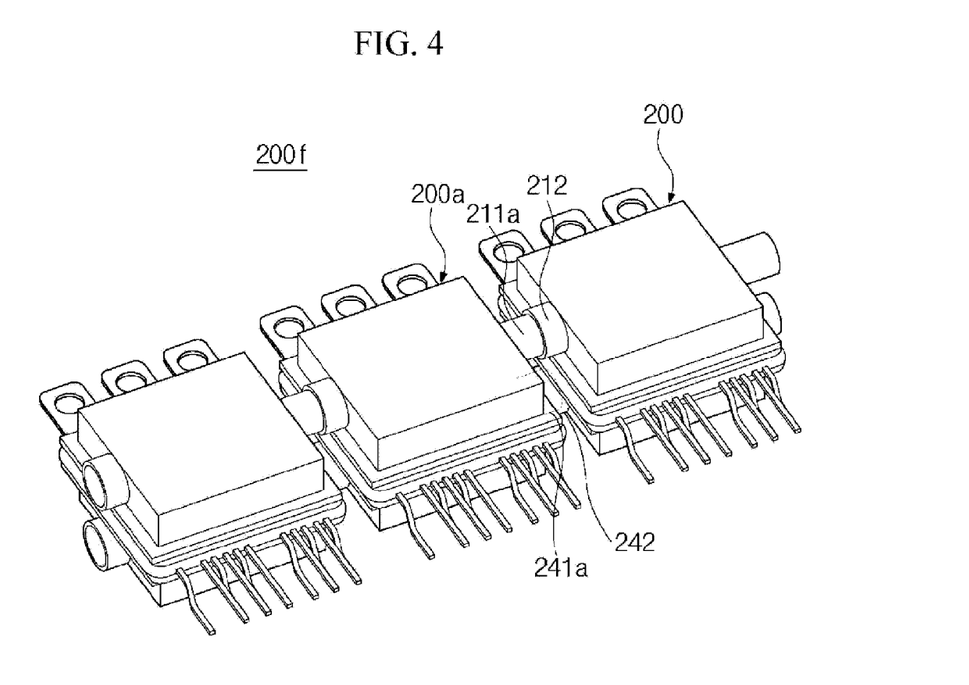

FIGS. 3 and 4 are perspective views for describing a coupling relationship between the cooling segments illustrated in FIG. 2.

Referring to FIGS. 3 and 4, cooling segments 200 and 200a have the same size and the same shape, a first connection pipe 211a and a second connection pipe 212 are located at the same height in the same connection direction, and a third connection pipe 241a and a fourth connection pipe 242 are also located at the same height in the same connection direction.

Therefore, the cooling segment 200 and another adjacent cooling segment 200a are formed as a cooling segment assembly 200f having a serial connection structure as illustrated in FIG. 4 by fitting the first connection pipe 211a and the second connection pipe 212 which correspond to each other and by fitting the third connection pipe 241a and the fourth connection pipe 242 which correspond to each other.

Specifically, in the cooling segment assembly 200f having a serial connection structure, an interval between the cooling segment 200 and the other adjacent cooling segment 200a may be constant.

Therefore, an interval between the power semiconductors 300 mounted on the cooling segments 200 and 200a or an interval between pins of the power semiconductor 300 may also be constant, the pins may be easily arranged when the pins of the power semiconductor 300 are connected to a PCB, and thus a cycle time of an assembling process of the PCB and the power semiconductor 300 may be relatively reduced and productivity may be increased.

Figure 5:
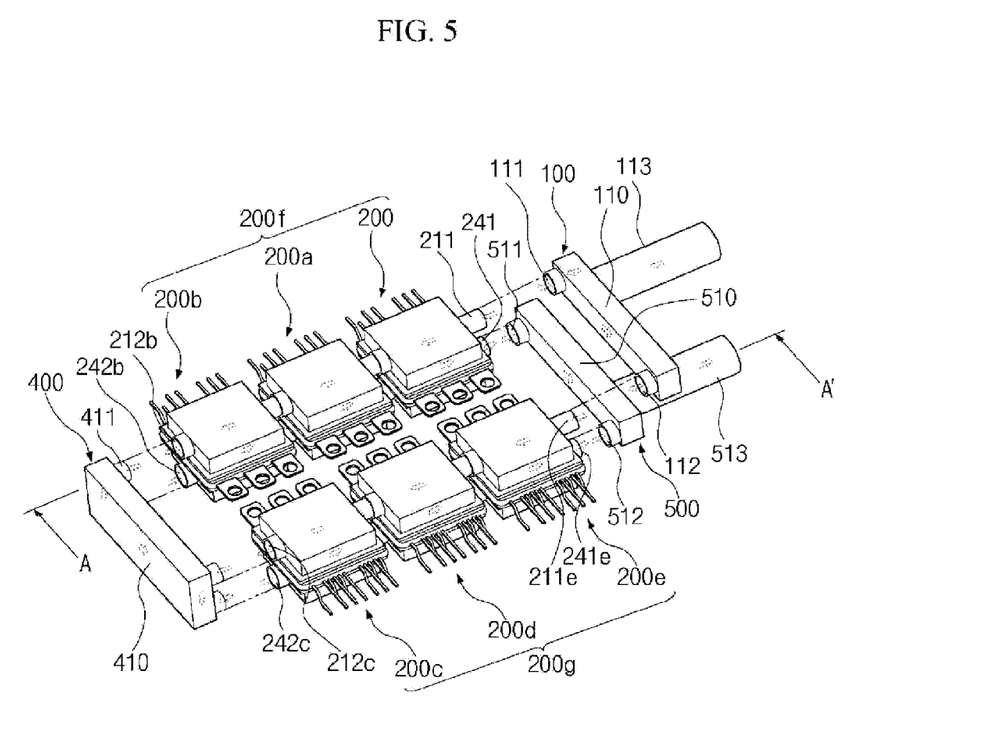
FIG. 5 is a perspective view for describing a coupling relationship between the cooling segments illustrated in FIG. 3, an inlet tank, an outlet tank, and a connection tank.
Figure 6:
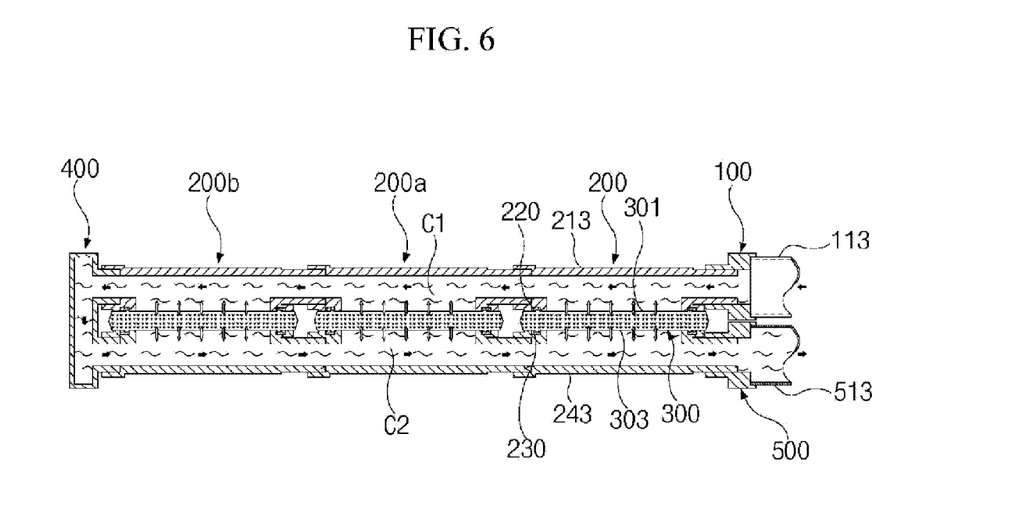
FIG. 6 is a cross-sectional view of the coupling relationship taken along line A-A' illustrated in FIG. 5.

FIG. 5 is a perspective view for describing a coupling relationship between the cooling segments, the inlet tank, the outlet tank, and the connection tank, which are illustrated in FIG. 3, and FIG. 6 is a cross-sectional view of the coupling relationship taken along line A-A' illustrated in FIG. 5.

Referring to FIG. 5, a plurality of cooling segment assemblies 200f and 200g having a serial connection structure (e.g., two rows) may be formed through a repetition of the coupling process illustrated in FIGS. 3 and 4.

That is, the cooling segments 200, 200a, 200b, 200c, 200d, and 200e are serially connected to each other to become the cooling segment assemblies 200f and 200g having the serial connection structure.

The cooling segment assemblies 200f and 200g are disposed between the inlet tank 100 and the connection tank 400 or between the outlet tank 500 and the connection tank 400.

The cooling segment assemblies 200f and 200g are spaced apart from each other in a parallel connection structure. However, a fluid may flow inside the cooling segment assemblies 200f and 200g.

The inlet tank 100 has an inlet pipe 113 for introducing a fluid, and a plurality of first fitting units 111 and 112 which are respectively connected to first connection pipes 211 and 211e of the cooling segments 200 and 200e.

Further, the inlet tank 100 includes a first distribution header 110 having an internal volume, which is connected between the inlet pipe 113 and the first fitting units 111 and 112 and passing therethrough and distributes the introduced fluid to the first fitting units 111 and 112.

The outlet tank 500 includes a second distribution header 510. The second distribution header 510 may have the same volume and shape as the first distribution header 110, and may be stacked below the first distribution header 110.

An insulation pad for heat blocking may be disposed at a boundary between the second distribution header 510 and the first distribution header 110, or an air layer or an adhesive layer of a thermal barrier material may be formed at the boundary. The insulation pad, the air layer, the adhesive layer, or the like may be a means for efficiently blocking heat exchange between the second distribution header 510 and the first distribution header 110.

The outlet tank 500 has a discharge pipe 513 for discharging the fluid, and a plurality of second fitting units 511 and 512 which are respectively connected to third connection pipes 241 and 241e of the cooling segments 200 and 200e.

Further, the second distribution header 510 of the outlet tank 500 is formed between the discharge pipe 513 and the second fitting units 511 and 512 and has an internal volume which discharges the fluid inside the second distribution header 510 to the discharge pipe 513.

In a plan view of the present embodiment, the inlet pipe 113 of the inlet tank 100 is disposed to be eccentric compared to the discharge pipe 513 of the outlet tank 500, and thus a hose which will be connected to the inlet pipe 113 or the discharge pipe 513 may be easily connected thereto.

The connection tank 400 serves to receive a fluid in the upper boxes of the cooling segments 200b and 200c disposed on a side opposite to the inlet tank 100 and the outlet tank 500, that is, the other side thereof, and supply the fluid into the lower boxes of the same cooling segments 200b and 200c.

To this end, the connection tank 400 includes a third distribution header 410 having an internal volume for receiving the fluid in the upper boxes or supplying the fluid into the lower boxes, and a plurality of third fitting units 411 (e.g., four) which are formed on side surfaces of the third distribution header 410 facing the cooling segments 200b and 200c and which are connected to the second connection pipes 212b and 212c or the fourth connection pipes 242b and 242c and passing therethrough.

For example, two of the four third fitting units 411, which are spaced apart from each other at a side of the cooling segment assembly 200f in a first column in a vertical direction are connected to the second connection pipe 212b or the fourth connection pipe 242b of the cooling segment 200b, which is disposed at an end of the cooling segment assembly 200f, and passing therethrough.

In the same manner, the other two of the four third fitting units 411, which are spaced apart from each other at a side of the cooling segment assembly 200g in a second column in the vertical direction, are connected to the second connection pipe 212c or the fourth connection pipe 242c of the cooling segment 200c, which is disposed at an end of the cooling segment assembly 200g, and passing therethrough.

Hereinafter, operations of the apparatus with the direct cooling pathway for cooling both sides of a power semiconductor according to the present embodiment will be described with reference to FIGS. 5 and 6.

A fluid cooled in an unillustrated external heat emission apparatus enters inside of the inlet tank 100 through the inlet pipe 113.

Then, the fluid inside the inlet tank 100 flows along an upper direct cooling pathway C1 formed on the cooling segments 200, 200a, and 200b which are sequentially connected to each other. In this case, the fluid inside the corresponding upper first hollow body 213 comes into direct contact with a top surface of the power semiconductor 300. In this case, a first heat exchange is performed between heat generated in the power semiconductor 300 and coolness of the fluid.

The fluid distributed inside the inlet tank 100 also flows along the corresponding cooling segments 200e, 200d, and 200c in the same manner, and the first heat exchange is also performed thereon.

Meanwhile, the first heat exchange is completed, and fluid discharged from the last cooling segments 200b and 200c is introduced into the connection tank 400.

The fluid in the connection tank 400 flows along a lower direct cooling pathway C2 of the cooling segments 200b, 200a, 200, 200c, 200d, and 200e.

In this process, the fluid inside the corresponding lower second hollow body 243 comes into direct contact with a bottom surface of the power semiconductor 300. In this case, a second heat exchange is performed between heat generated in the power semiconductor 300 and coolness of the fluid.

After the fluid on which all of the heat exchanges are completed reaches an inside of the outlet tank 500, the fluid is returned to the external heat emission apparatus through the discharge pipe 513.

Further, the returned fluid is re-cooled in the external heat emission apparatus and cools the power semiconductor 300 using a direct cooling method by being repeatedly re-supplied into the apparatus in the present embodiment.

In the present embodiment, there is an advantage in that efficiency of heat exchange is relatively very high compared to an indirect cooling method in which a fluid is cooled through a fluid pathway wall (e.g., a tube wall) between the fluid and an object.

For example, as a result of confirmation through experiments, thermal resistance in the present embodiment is improved by 50% compared to the indirect cooling method in the same capacity.

In the apparatus with the direct cooling pathway for cooling both sides of a power semiconductor according to embodiments of the present invention, a plurality of cooling segments, which cover a top portion and a bottom portion of a power semiconductor and may flow a fluid such as a cooling medium, cooling water, a heat exchange medium, or the like, are assembled thereinto along a direction of a direct cooling pathway, coolness of the fluid or heat of the power semiconductor directly performs cooling or heat exchange, and thus efficiency of heat exchange can be relatively increased.

Further, in the apparatus with the direct cooling pathway for cooling both sides of a power semiconductor according to embodiments of the present invention, a thermal grease applying process performed between an outer surface of a tube and an outer surface of a power semiconductor is removed from the existing heat exchange apparatus using a tube, and thus productivity can be increased.

Further, in the apparatus with the direct cooling pathway for cooling both sides of a power semiconductor according to embodiments of the present invention, a cooling segment is formed to have a structure in which an upper box of which a bottom surface is open and a lower box of which a top surface is open are directly adhered to a top surface or a bottom surface of a power semiconductor to cover the surface, a thickness of the apparatus in which the power semiconductor is interposed is relatively reduced compared to an apparatus in the related art, and thus a compact apparatus structure can be implemented.

Further, in the apparatus with the direct cooling pathway for cooling both sides of a power semiconductor according to embodiments of the present invention, heat exchange in a direct cooling method is performed, efficiency of the heat exchange is relatively very high, and thus overall cooling efficiency of a package module including a plurality of power semiconductors can also be increased.

Further, in the apparatus with the direct cooling pathway for cooling both sides of a power semiconductor according to embodiments of the present invention, a method in which a cooling segment is directly adhered to a power semiconductor is used, a rectangular-ring shaped first O-ring or a second O-ring is installed in a mounting groove of a flange of an edge of a bottom surface of an upper box of the cooling segment or an edge of a top surface of a lower box thereof, and thus airtightness can be maintained so that a fluid does not leak outside the cooling segment. The O-rings are not pressed to the power semiconductor as in the existing method, and thus possibility of quality issues can be blocked.

Further, in the apparatus with the direct cooling pathway for cooling both sides of a power semiconductor according to embodiments of the present invention, an interval between power semiconductors, which are connected to each of a plurality of cooling segments, an inlet tank, an outlet tank, and a connection tank and passing therethrough, and are interposed between the corresponding cooling segments to correspond to an interval between the cooling segments, can be constantly maintained. Therefore, when pins of the power semiconductor are connected to a PCB, the pins can be easily arranged. A process of arranging positions of the pins described in the related art is removed when the apparatus in the present invention is assembled. As a result, a cycle time of an assembling process of a PCB can be reduced and productivity can be increased.

Further, the apparatus with the direct cooling pathway for cooling both sides of a power semiconductor according to embodiments of the present invention has a structure in which cooling segments are modularized and connected to each other. According to an increase or reduction of the number of the power semiconductors, there is no need to manufacture a new cooling segment having a large size. Due to a structure in which the cooling segments are connected to each other in a module method, the apparatus in the present invention can have extensibility and versatility.

While the present invention has been particularly described with reference to embodiments, it should be understood by those of skilled in the art that various changes in form and details may be made without departing from the spirit and scope of the present invention. Therefore, the embodiments should be considered in a descriptive sense only and not for purposes of limitation. The scope of the invention is defined not by the detailed description of the invention but by the appended claims, and encompasses all modifications and equivalents that fall within the scope of the appended claims.

What is claimed is:

1. An apparatus with a direct cooling pathway for cooling both sides of each of a plurality of power semiconductors, the apparatus comprising:
   a plurality of cooling segments, each of the cooling segments including an upper box having an open bottom surface facing a top surface of a corresponding one of the power semiconductors and adhered to the top surface of the corresponding one of the power semiconductors, and a lower box having an open top surface facing a bottom surface of the corresponding one of the power semiconductors and adhered to the bottom surface of the corresponding one of the power semiconductors;
   an inlet tank connected to an end portion of one side of the upper box of a first one of the cooling segments and configured to allow fluid to be introduced and pass therethrough, and into which the fluid is introduced;
   an outlet tank connected to an end portion of one side of the lower box of the first one of the cooling segments and configured to allow the fluid to pass therethrough and be discharged; and
   a connection tank connected to an end portion of another side of each of the upper box and the lower box of a second one of the cooling segments and configured to allow the fluid to pass therethrough,
   wherein immediately neighboring two of the plurality of cooling segments are connected to each other, a direct cooling pathway is formed between the inlet tank and the connection tank, and between the outlet tank and the connection tank such that the fluid comes into direct contact with the top surface and the bottom surface of each of the power semiconductors and cools each of the power semiconductors.

2. The apparatus of claim 1, wherein the upper box includes:
   a first hollow body having closed side surfaces and a closed top surface;
   a first connection pipe corresponding to the end portion of the one side of the upper box, formed to pass through one of the side surfaces of the first hollow body, and having a diameter smaller than a height of the upper box;
   a second connection pipe corresponding to the end portion of the another side of the upper box, formed to pass through another of the side surfaces of the first hollow body, and having a stopping jaw formed inside an inner diameter into which a first connection pipe of an adjacent one of the cooling segments is inserted;
   a first flange configured to protrude from an edge of a bottom surface of the first hollow body in an outward direction, having a mounting groove formed on the bottom surface thereof, and in which the bottom surface except for a portion in which the mounting groove is formed is adhered to the top surface of the corresponding one of the power semiconductors; and
a first O-ring coupled to the mounting groove of the first flange.

3. The apparatus of claim 2, wherein the lower box includes:
a second hollow body having closed side surfaces and a closed bottom surface;
a third connection pipe corresponding to the end portion of the one side of the lower box, formed to pass through one of the side surfaces of the second hollow body, and having a diameter smaller than a height of the lower box;
a fourth connection pipe corresponding to the end portion of the another side of the lower box, formed to pass through another of the side surfaces of the second hollow body, and having a stopping jaw formed inside an inner diameter into which a third connection pipe of the adjacent one of the cooling segments is inserted;
a second flange configured to protrude from an edge of a top surface of the second hollow body in an outward direction, having a mounting groove formed on the top surface thereof, and in which the top surface except for a portion in which the mounting groove is formed is adhered to the bottom surface of the corresponding one of the power semiconductors; and
a second O-ring coupled to the mounting groove of the second flange,
wherein the lower box is formed to be vertically symmetrical to the upper box.

4. The apparatus of claim 3, wherein, in each of the cooling segments,
the corresponding one of the power semiconductors is interposed between the upper box and the lower box; and
pins of the corresponding one of the power semiconductors protrude from both sides of the power semiconductor in a direction perpendicular to a connection direction of any one connection pipe of the first connection pipe to the fourth connection pipe.

5. The apparatus of claim 3, wherein the outlet tank includes:
a discharge pipe from which the fluid is discharged;
a plurality of second fitting units, one of the second fitting units connected to the third connection pipe of the first one of the cooling segments; and
a second distribution header formed between the discharge pipe and the second fitting units and having an internal volume which discharges the fluid to the discharge pipe.

6. The apparatus of claim 3, wherein the connection tank includes:
a third distribution header having an internal volume for receiving the fluid from the upper box of the second one of the cooling segments and configured to supply the fluid to the lower box of the second one of the cooling segments; and
a plurality of third fitting units formed on a side surface of the third distribution header and configured to allow the fluid to pass therethrough, a first one of the third fitting units connected to the second connection pipe of the second one of the cooling segments, and a second one of the third fitting units connected to the fourth connection pipe of the second one of the cooling segments.

7. The apparatus of claim 2, wherein the inlet tank includes:

an inlet pipe into which the fluid is introduced;
a plurality of first fitting units, one of the first fitting units connected to the first connection pipe of the first one of the cooling segments; and
a first distribution header connected between the inlet pipe and the first fitting units and configured to allow the fluid to pass therethrough, and having an internal volume which distributes the fluid to the first fitting units.

8. The apparatus of claim 1, further comprising a plurality of cooling segment assemblies,
wherein a subset of the cooling segments are serially connected to each other between the inlet tank and the connection tank and between the outlet tank and the connection tank and constitute one of the cooling segment assemblies having a serial connection structure, each subset of the cooling segment assemblies is parallelly connected to at least one other of the subset of the cooling segment assemblies and is spaced apart from each of the at least one other of the subset of the cooling segment assemblies to form a parallel connection structure.

9. The apparatus of claim 8, wherein the upper box includes:
a first hollow body having closed side surfaces and a closed top surface;
a first connection pipe corresponding to the end portion of the one side of the upper box, formed to pass through one of the side surfaces of the first hollow body, and having a diameter smaller than a height of the upper box;
a second connection pipe corresponding to the end portion of the another side of the upper box, formed to pass through another of the side surfaces of the first hollow body, and having a stopping jaw formed inside an inner diameter into which a first connection pipe of an adjacent one of the cooling segments is inserted;
a first flange configured to protrude from an edge of a bottom surface of the first hollow body in an outward direction, having a mounting groove formed on the bottom surface thereof, and in which the bottom surface except for a portion in which the mounting groove is formed is adhered to the top surface of the corresponding one of the power semiconductors; and
a first O-ring coupled to the mounting groove of the first flange.

10. The apparatus of claim 9, wherein the lower box includes:
a second hollow body having closed side surfaces and a closed bottom surface;
a third connection pipe corresponding to the end portion of the one side of the lower box, formed to pass through one of the side surfaces of the second hollow body, and having a diameter smaller than a height of the lower box;
a fourth connection pipe corresponding to the end portion of the another side of the lower box, formed to pass through another of the side surfaces of the second hollow body, and having a stopping jaw formed inside an inner diameter into which a third connection pipe of the adjacent one of the cooling segments is inserted;
a second flange configured to protrude from an edge of a top surface of the second hollow body in an outward direction, having a mounting groove formed on the top surface thereof, and in which the top surface except for a portion in which the mounting groove is formed is adhered to the bottom surface of the corresponding one of the power semiconductors; and a second O-ring coupled to the mounting groove of the second flange, wherein the lower box is formed to be vertically symmetrical to the upper box.

11. The apparatus of claim 10, wherein the outlet tank includes:

a discharge pipe from which the fluid is discharged;

a plurality of second fitting units each connected to the third connection pipe of the first one of each of the cooling segment assemblies, respectively; and a second distribution header formed between the discharge pipe and the second fitting units and having an internal volume which discharges the fluid to the discharge pipe.

12. The apparatus of claim 10, wherein the connection tank includes:

a third distribution header having an internal volume for receiving the fluid from the upper box of the second one of each of the cooling segment assemblies and configured to supply the fluid to the lower box of the second one of each of the cooling segment assemblies; and a plurality of third fitting units formed on a side surface of the third distribution header and configured to allow the fluid to pass therethrough, a first one of the third fitting units connected to the second connection pipe of the second one of each of the cooling segment assemblies, respectively, and a second one of third fitting units connected to the fourth connection pipe of the second one of each of the cooling segment assemblies, respectively.

13. The apparatus of claim 9, wherein the inlet tank includes:

an inlet pipe into which the fluid is introduced;

a plurality of first fitting units each connected to the first connection pipe of the first one of each of the cooling segment assemblies, respectively; and a first distribution header connected between the inlet pipe and the first fitting units and configured to allow the fluid to pass therethrough, and having an internal volume which distributes the fluid to the first fitting units.

* * * * *